United States Patent
Kitada

(10) Patent No.: US 9,202,752 B2
(45) Date of Patent: Dec. 1, 2015

(54) SEMICONDUCTOR DEVICE WITH FIRST AND SECOND SEMICONDUCTOR SUBSTRATES

(75) Inventor: Hideki Kitada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 741 days.

(21) Appl. No.: 12/718,448

(22) Filed: Mar. 5, 2010

(65) Prior Publication Data

US 2010/0244201 A1    Sep. 30, 2010

(30) Foreign Application Priority Data

Mar. 25, 2009  (JP) ................................. 2009-074765

(51) Int. Cl.
*H01L 29/40* (2006.01)
*H01L 21/768* (2006.01)
(Continued)

(52) U.S. Cl.
CPC ...... *H01L 21/76898* (2013.01); *H01L 21/6835* (2013.01); *H01L 23/481* (2013.01); *H01L 24/11* (2013.01); *H01L 24/16* (2013.01); *H01L 24/29* (2013.01); *H01L 24/32* (2013.01); *H01L 24/81* (2013.01); *H01L 24/83* (2013.01); *H01L 24/92* (2013.01); *H01L 25/0657* (2013.01); *H01L 2224/13009* (2013.01); *H01L 2224/13099* (2013.01); *H01L 2224/2919* (2013.01); *H01L 2224/838* (2013.01); *H01L 2224/9202* (2013.01); *H01L 2225/06541* (2013.01); *H01L 2924/0105* (2013.01); *H01L 2924/01006* (2013.01); *H01L 2924/01022* (2013.01);
(Continued)

(58) Field of Classification Search
CPC ..................... H01L 21/6835; H01L 21/76898; H01L 23/481; H01L 24/29; H01L 24/32; H01L 24/83; H01L 24/92; H01L 25/0657

USPC ............................ 257/621, 774; 438/107, 455
See application file for complete search history.

(56) References Cited

U.S. PATENT DOCUMENTS 6,198,159 B1    3/2001    Hosoma et al.
6,376,048 B1    4/2002    Takeishi
(Continued)

FOREIGN PATENT DOCUMENTS

| JP | 10-163411 A | 6/1998 |
| JP | 10-268506 A | 10/1998 |
| JP | 2000-021873 A | 1/2000 |
| JP | 2001-94039 A | 4/2001 |
| JP | 2001-177048 A | 6/2001 |

(Continued)

OTHER PUBLICATIONS

Taiwanese Office Action dated Feb. 23, 2013, issued in corresponding Taiwanese Patent Application No. 099106720 w/ English translation.

*Primary Examiner* — Laura Menz
*Assistant Examiner* — Candice Y Chan
(74) *Attorney, Agent, or Firm* — Westerman, Hattori, Daniels & Adrian, LLP

(57) ABSTRACT

A semiconductor device includes a first semiconductor substrate including a first integrated circuit, a second semiconductor substrate mounted over the first semiconductor substrate, the second semiconductor substrate including a second integrated circuit, a post made of an inorganic substance and formed over the first semiconductor substrate, an adhesive layer made of an organic substance arranged between the first and the second semiconductor substrates, and a substrate-through-via made of an electrical conductor extending through the second semiconductor substrate and the post, the substrate-through-via extending to the first semiconductor substrate.

4 Claims, 5 Drawing Sheets

(51) Int. Cl.
*H01L 21/683* (2006.01)
*H01L 23/48* (2006.01)
*H01L 23/00* (2006.01)
*H01L 25/065* (2006.01)

(52) U.S. Cl.
CPC ............ *H01L 2924/01029* (2013.01); *H01L 2924/01033* (2013.01); *H01L 2924/01059* (2013.01); *H01L 2924/01074* (2013.01); *H01L 2924/01078* (2013.01); *H01L 2924/01079* (2013.01); *H01L 2924/0665* (2013.01); *H01L 2924/12044* (2013.01); *H01L 2924/13091* (2013.01); *H01L 2924/14* (2013.01); *H01L 2924/15788* (2013.01)

(56) References Cited

U.S. PATENT DOCUMENTS

| | | | |
|---|---|---|---|
| 7,326,629 B2 * | 2/2008 | Nagarajan et al. | 438/459 |
| 2002/0119640 A1 * | 8/2002 | Gonzalez | 438/455 |
| 2009/0014843 A1 | 1/2009 | Kawashita et al. | |
| 2010/0065949 A1 * | 3/2010 | Thies et al. | 257/621 |
| 2010/0327422 A1 * | 12/2010 | Lee et al. | 257/690 |

FOREIGN PATENT DOCUMENTS

| | | |
|---|---|---|
| JP | 2001-326326 A | 11/2001 |
| TW | 2005-25767 A | 8/2005 |

\* cited by examiner

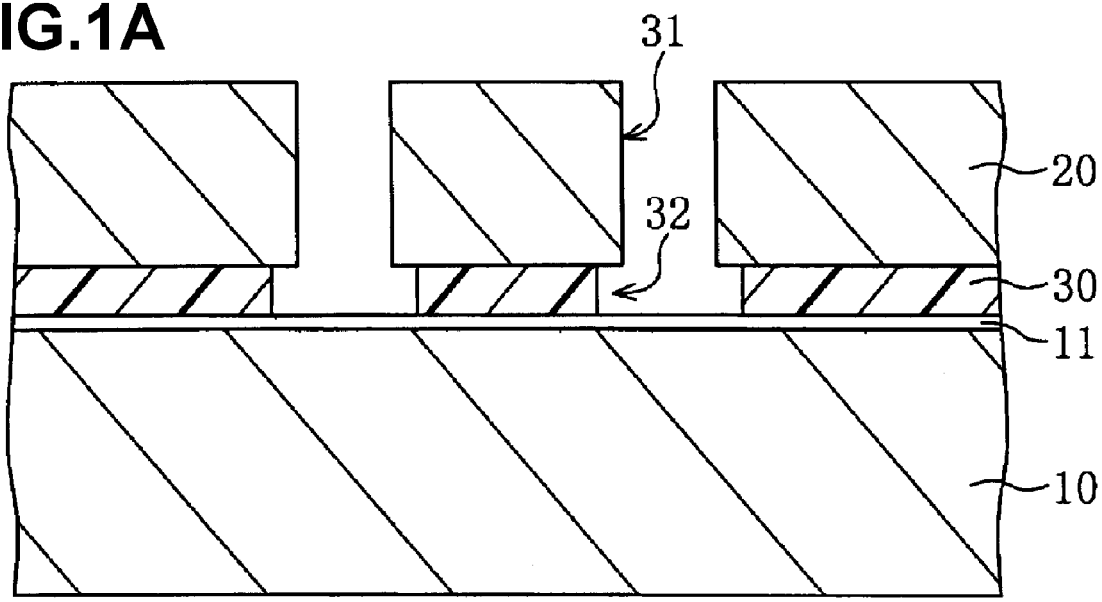
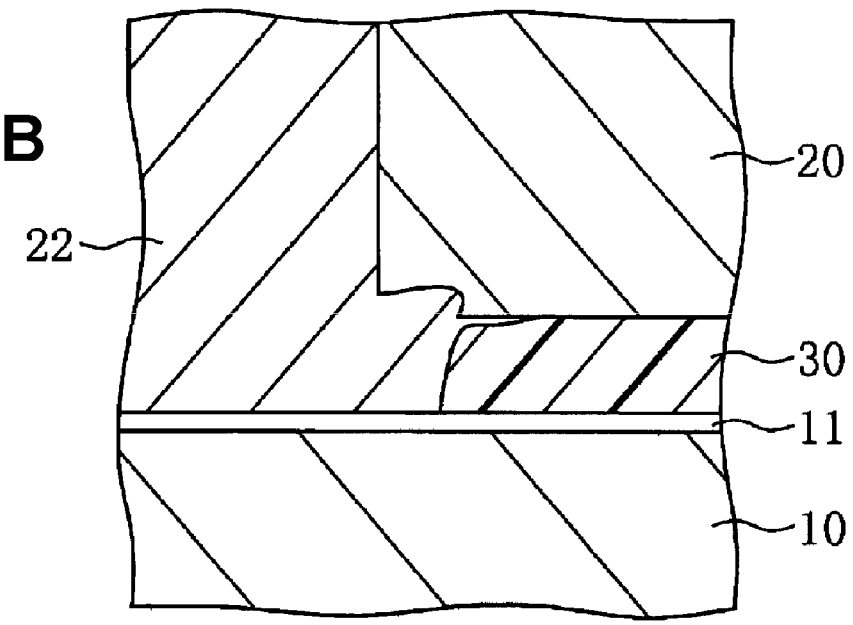

FIG.1C

| | MATERIAL | THERMAL EXPANSION COEFFICIENT (ppm/°C) |
|---|---|---|
| INORGANIC | $SiO_2$ | 0.35 |
| | TEOS | 0.94 |
| | Si | 2.3 |
| | SiN | 4.2 |
| | $B_4C$ | 4.5 |
| | NCS | 10 – 14 |
| | Cu | 16 |
| ORGANIC | PBO | 40 |
| | SiLK | 66 |
| | PI | 50 |
| | BCB | 55 |
| | PAE | 75 |

SEMICONDUCTOR DEVICE WITH FIRST AND SECOND SEMICONDUCTOR SUBSTRATES

CROSS-REFERENCE TO RELATED APPLICATION

This application is based upon and claims the benefit of priority of the prior Japanese Patent Application No. 2009-74765 filed on Mar. 25, 2009, the entire contents of which are incorporated herein by reference.

FIELD

An aspect of the embodiments discussed herein is directed to a semiconductor device including a laminate structure of semiconductor substrates.

BACKGROUND

The degree of integration of semiconductor integrated circuit devices has been increasing. Reductions in size have been achieved in accordance with a scaling rule. As for an in-plane basic dimension, techniques complying with the 90 nm rule and the 65 nm rule have already become established. The 32 nm rule has been developed and its limit is being approached.

In recent years, the integration of semiconductor microchips has shifted from two-dimensional integration in which the degree of in-plane integration is increased to three-dimensional integration in which a plurality of chips are vertically laminated. Chips contained in cellular phones are mainly formed by the system-in-package technique. Devices in which chips are laminated such as flash memories have been released in countries other than Japan. There has been a trend that such three-dimensional integration techniques are further growing in use. Production of devices by three-dimensional integration techniques requires a process of laminating wafers and chips (collectively referred to as substrates) and a process of electrically connecting the laminated substrates.

A process of bonding substrates to each other, the substrates including semiconductor integrated circuits in which semiconductor devices such as MOS transistors are integrated, is desirably conducted at a temperature at which the distribution of dopants in the semiconductor devices is not changed.

Japanese Laid-open Patent Publication No. 10-275752 discusses that methods of forming bonded wafers such as a direct bonding method, an electrostatic bonding method, and a soot glass bonding method require a bonding temperature of more than 1000° C., a bonding period of several hours to several tens of hours, and a large heat-treatment furnace. Japanese Laid-open Patent Publication No. 10-275752 discusses that at least two wafers be bonded to each other with a noncrystalline aromatic polyimide monolayer or an aromatic polyimide member in which a noncrystalline aromatic polyimide layer is formed on each surface of a base polyimide layer.

Japanese Laid-open Patent Publication No. 2001-326326 discusses that the following formation of substrate-through-via electrical conductors. When device isolation regions of the shallow trench isolation (STI) type are formed in a substrate, some of the device isolation regions are made deeper than the other device isolation regions. Deep trenches are formed in the deep device isolation regions and wiring grooves that are to be filled with a first wiring layer are subsequently formed. The trenches and the wiring grooves are filled with the wiring layer to provide an integrated circuit device. After that, the back surface of the substrate is ground and polished to thereby expose the wiring embedded in the deep device isolation regions and form substrate-through-via electrical conductors.

SUMMARY

According to an aspect of an embodiment, semiconductor device includes a first semiconductor substrate including a first integrated circuit, a second semiconductor substrate mounted over the first semiconductor substrate, the second semiconductor substrate including a second integrated circuit, a post made of an inorganic substance and formed over the first semiconductor substrate, an adhesive layer made of an organic substance arranged between the first and the second semiconductor substrates, and a substrate-through-via made of an electrical conductor extending through the second semiconductor substrate and the post, the substrate-through-via extending to the first semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a sectional view of a sample in a preliminary experiment of bonding an upper substrate onto a lower substrate and forming substrate-through via holes extending through the upper substrate;

FIG. 1B is a sketch from a photograph of a section of the sample in which the substrate-through via holes are filled with a copper layer;

FIG. 1C is a table illustrating the thermal expansion coefficients of various materials.

DESCRIPTION OF EMBODIMENTS

Figure 2A:
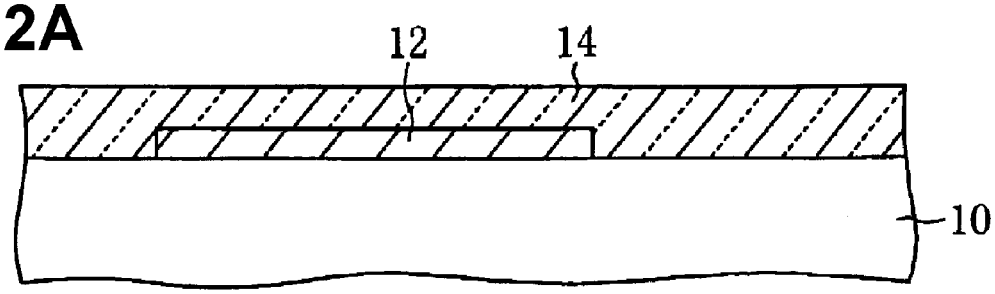
FIGS. 2A to 2J are sectional views illustrating major steps of a method of forming a semiconductor device including a laminated substrate according to an embodiment of the present invention.

As described previously, bonding with an organic resin bonding adhesive composed of a polyimide resin, an epoxy resin, or the like may be conducted at a relatively low temperature at which the distribution of dopants is not substantially changed. Bonding with a polyimide resin is conducted in the range of about several tens of ° C. to 400° C. Bonding with an epoxy resin is conducted at about 180° C.

To laminate a second substrate onto a first substrate and to electrically connect the wiring on the first substrate to the wiring of the second substrate, substrate-through-via electrical conductors extending through the second substrate are desirably formed. However, since a silicon substrate generally has a thickness of 600 nm or more, it is considerably difficult to form via holes extending through a silicon substrate having such a thickness and to fill the via holes with substrate-through-via electrical conductors.

When via holes are formed through a substrate having a large thickness, the resultant via holes have a high aspect ratio, it may cause an increase in process cost or low reliability. For example, defects in terms of formation of through holes, achievement of a sufficiently high barrier property, filling of via holes, or the like are caused. It is preferable to bond a support base to the front surface of an upper substrate to be laminated and the upper substrate is thinned by subjecting the back surface of the upper substrate to grinding, polishing, wet etching, or the like. The thus-thinned upper substrate is laminated to another substrate. Such thinning of a substrate facilitates a process of forming via holes extending through the substrate. Additionally, use of a process of connecting wiring through via holes having a low aspect ratio may reduce development cost.

As for processes for forming substrate-through-via electrical conductors, there are a via-first approach in which substrate-through-via electrical conductors for establishing electrical connection are formed in a substrate and the resultant substrate is subsequently laminated onto another substrate, and a via-last approach in which an upper substrate is laminated onto a lower substrate and substrate-through-via electrical conductors are subsequently formed in the upper substrate.

Moreover, the via-last approach is conducted as follows. An upper substrate is laminated onto a lower substrate. Substrate-through via holes are formed in the laminated upper substrate so as to extend to the electrical-connection member of the lower substrate. A barrier metal layer is formed so as to cover the interior wall of the via holes. The resultant via holes are filled with a main electrical conductive material.

After the process by using the via-first approach or the via-last approach is performed, such as poor contact, degradation of characteristics, or degradation of reliability may be caused.

To form a three-dimensionally integrated semiconductor device by bonding a plurality of LSI silicon substrates together with an organic resin, a preliminary experiment of bonding substrates together was conducted. As for a bonding resin material, BCB (benzo-cyclo-butene, specifically, CYCLOTENE, which is the name of a product available from The Dow Chemical Company) was used.

Referring to FIG. 1A, a silicon substrate 20 that had been thinned was bonded onto a surface of a lower substrate 10 with a bonding resin (CYCLOTENE) layer 30, the lower substrate 10 including, if necessary, a silicon oxide film 11. Via holes 31 were formed in the bonded substrates by anisotropic etching through a resist mask. Silicon was etched with a gas mixture of $SF_6$ and $C_4F_8$. The bonding resin (CYCLOTENE) was etched with a gas mixture of $SF_6$ and $O_2$. The resultant via holes 31 were substantially perpendicular to the silicon substrate 20. However, since the bonding resin layer 30 had etching characteristics different from those of the silicon substrate 20, the bonding resin layer 30 suffered from side etching and an undercut 32 entering a portion under the bottom surface of the silicon substrate 20 was generated. The undercut 32 had a width of about 5 μm.

The presence of such an undercut results in a decrease in the coverage of a barrier insulation film (SiN film) to be deposited by chemical vapor deposition (CVD), depending on a position to be covered by the barrier insulation film. As a result, since a barrier metal layer and a Cu seed layer are formed on the barrier insulation film by sputtering or the like, the coverage of the barrier metal layer and the Cu seed layer also decreases. Cu is electrolytically plated onto the Cu seed layer. However, such film formation by plating is hampered in portions where the barrier insulation film, the barrier metal layer, and the Cu seed layer are thin or none of the above is present. There is also a possibility that voids are generated. When copper in the plated copper layer passes through the barrier metal layer and the barrier insulation film and a reaction between the copper and silicon in the substrate is effected, silicide is generated, which may increase the resistance of via electrical conductors. Diffusion of copper into the silicon substrate may result in degradation of characteristics of the devices.

Si has a thermal expansion coefficient of 2.3 ppm/° C. and Cu has one of 16 ppm/° C. whereas BCB has one of 55 ppm/° C. In general, an organic material has a higher thermal expansion coefficient than an inorganic material. When materials having thermal expansion coefficients that are significantly different from each other are in contact with each other, a large stress remains between the materials after a heating process. In particular, a large stress remains at a triple point at which three materials having thermal expansion coefficients that are significantly different from each other such as Si, Cu, and BCB are in contact with each other, which is likely to cause problems such as separation among the materials.

FIG. 1B is a sketch of an SEM image of a section of a sample obtained by bonding the upper silicon substrate 20 onto the lower substrate 10 including the silicon oxide film 11 with the BCB resin layer 30, forming via holes, and filling the via holes with Cu plugs 22. An undercut is caused in the BCB resin layer 30 under the upper silicon substrate 20. The BCB resin layer 30 is separated at its end from the upper silicon substrate 20. Such a separation results in degradation of the reliability.

FIG. 1C is a table illustrating the thermal expansion coefficients of various materials. The inorganic materials have a thermal expansion coefficient in the range of 0.35 to 16 ppm/° C. and the organic materials have a thermal expansion coefficient of 40 ppm/° C. or more. Thus, it is difficult to achieve a low thermal expansion coefficient when an organic material is used.

To bond a plurality of silicon substrates together at a low temperature, an organic bonding adhesive is preferably used. In view of formation of via holes, such an organic bonding adhesive desirably has good dry etching characteristics. In view of decreasing residual stress, such an organic bonding adhesive desirably has a low thermal expansion coefficient. However, an organic bonding material having these characteristics has still not been developed.

The inventor of the present embodiment has studied a structure in which such requirements do not have to be so strictly applied around via holes. In spite of use of an organic bonding adhesive, when use of the organic bonding adhesive may be avoided around substrate-through-via electrical conductors, many problems caused by organic materials may be suppressed.

FIGS. 2A to 2J are schematic sectional views illustrating a method of forming a semiconductor device in which substrates are three-dimensionally laminated according to an embodiment.

Referring to FIG. 2A, a rewiring layer 12 composed of Cu is formed on the lower substrate 10, which is a silicon wafer in which semiconductor integrated circuits are formed. The rewiring layer 12 is formed by, for example, forming a copper layer by sputtering, plating, or the like and etching the copper layer through a resist pattern serving as a mask. Depending on conditions, there is a case where such a rewiring layer is not required. A silicon oxide film 14 is then deposited on the lower substrate 10 so as to cover the rewiring layer 12 by plasma-enhanced chemical-vapor deposition (PE-CVD) with tetraethoxysilane (TEOS) serving as a material. Hereinafter, the silicon oxide film 14 is sometimes referred to as a P-TEOS film. The thickness of the P-TEOS film 14 is determined in accordance with a desired distance between the substrates. In a sample used in an experiment, the P-TEOS film 14 was formed so as to have a thickness of 4 μm. The P-TEOS film 14 has a flat surface even when the surface of the base on which the P-TEOS film 14 is formed has irregularities. The surface of the P-TEOS film 14 may be further flattened by chemical-mechanical polishing (CMP) or the like.

Figure 2B:
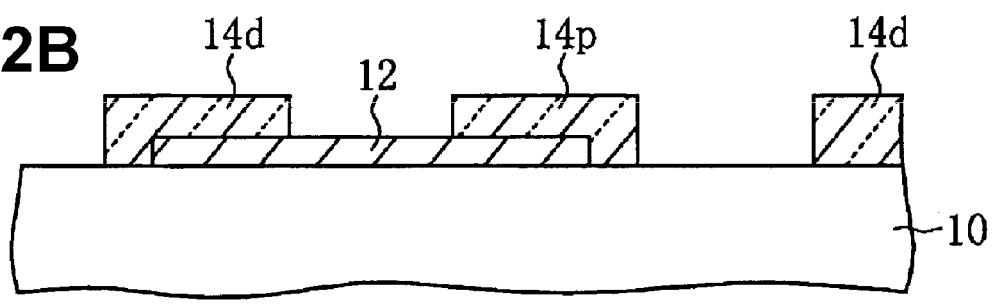

Referring to FIG. 2B, the P-TEOS film 14 is patterned by etching through a resist pattern serving as a mask to thereby form posts 14p in portions in which via holes are to be formed and in regions surrounding the portions. To maintain in-plane uniformity of the substrate, dummy posts 14d are also formed such that the posts including the posts 14p and the dummy posts 14d are substantially uniformly distributed over the substrate. In the sample used in the experiment, the via holes were formed so as to have a diameter of 20 µm and the posts 14p and the dummy posts 14d were formed so as to have a diameter of 30 µm. The P-TEOS film 14 was patterned by dry etching with a gas mixture of $CF_4$ and $O_2$. Alternatively, another type of dry etching or wet etching may also be used.

Figure 2C:
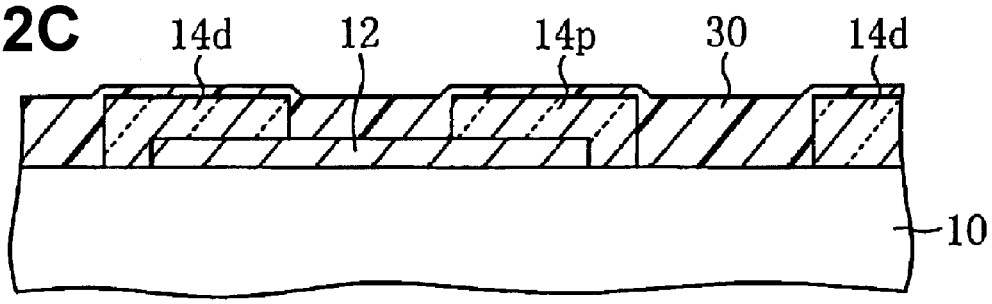

Referring to FIG. 2C, the organic bonding adhesive film 30 is spin-coated on the surface of the lower substrate 10. The organic bonding adhesive film 30 is subsequently baked to thereby evaporate the solvent in the organic bonding adhesive and provisionally harden the organic bonding adhesive film 30. As in the posts 14p, the thickness of the organic bonding adhesive film 30 is determined in accordance with a desired distance between the substrates. That is, the organic bonding adhesive film 30 is formed so as to have the same height as the posts 14p. The organic bonding adhesive film 30 is formed so as to not have a lower height than the posts 14p. In the sample used in the experiment, a BCB resin (CYCLOTENE, which is the name of a product available from The Dow Chemical Company) was used as the organic bonding adhesive. The coated organic bonding adhesive was baked at 150° C. and formed so as to have a thickness of 4 µm. Thus, the organic bonding adhesive film 30 having a thickness of about several hundreds of nanometers covered the surface of the P-TEOS film patterns 14p and 14d.

Figure 2D:
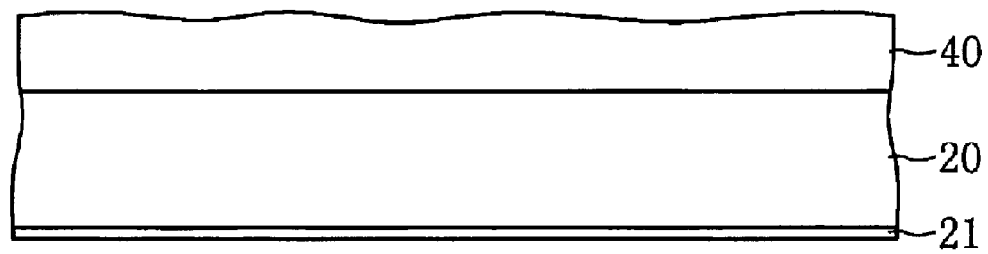
Figure 2D:
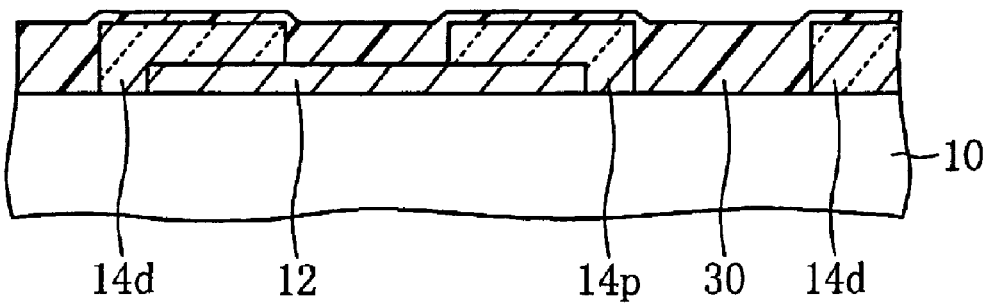

Referring to FIG. 2D, the upper substrate 20, which is a silicon wafer in which semiconductor integrated circuits are formed and a silicon oxide film 21 is formed on the back surface, is aligned above the lower substrate 10. This alignment of the upper and lower substrates is conducted with alignment marks formed on the substrates in advance. The upper substrate 20 is supported by a support base 40 such as a glass substrate that is temporarily bonded to the front surface of the upper substrate 20. The upper substrate 20 is thinned by grinding and polishing the back surface of the upper substrate 20. The upper substrate 20 is handled in the state of being supported by the support base 40. In the sample used in the experiment, the upper substrate 20 thinned to have a thickness of 40 µm was used.

Figure 2E:
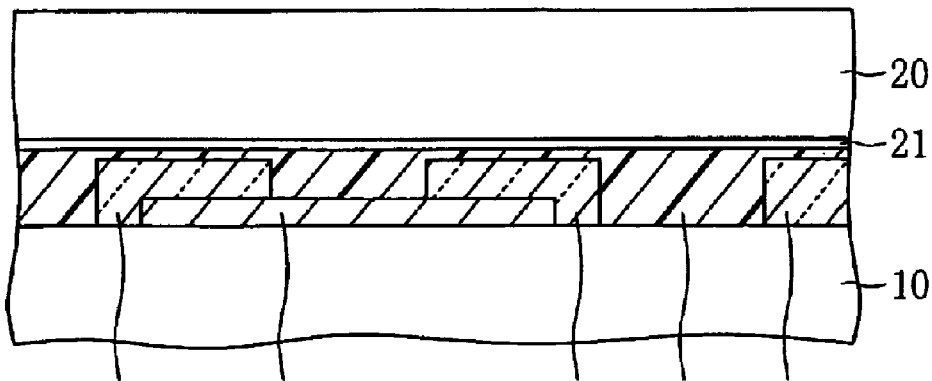

Referring to FIG. 2E, after the upper and lower substrates are aligned with each other, the upper and lower substrates are brought into contact with each other and bonded to each other under the application of heat and pressure. After that, the support base 40 is stripped off. In the sample used in the experiment, the aligned upper and lower substrates were bonded to each other by being left under the application of pressure in a vacuum atmosphere at 250° C. for 60 minutes. As a result of the application of the pressure, the thickness of the bonding adhesive film on the P-TEOS films 14p and 14d was reduced from about several hundreds of nanometers to about several tens of nanometers. However, since this bonding adhesive film, which is thin, is still present on the P-TEOS films 14p and 14d, a sufficiently high bonding effect is provided. After the upper substrate is laminated onto the lower substrate, substrate-through-via electrical conductors extending through the upper substrate are formed by the via-last approach.

Figure 2F:
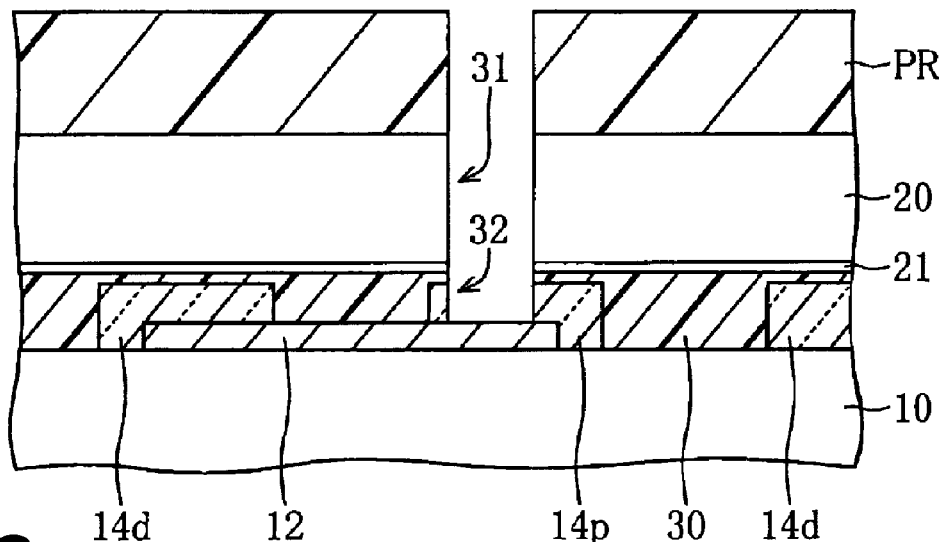

Referring to FIG. 2F, a photoresist pattern PR having openings corresponding to the positions of the via holes is formed. Since the upper substrate 20 has been bonded to the lower substrate 10 by aligning the upper substrate 20 and the lower substrate 10 with the alignment marks, the positions of the via holes may be determined with reference to the alignment marks of the upper substrate 20. The via holes 31 are formed by etching through the photoresist pattern PR serving as a mask. What are etched are the silicon of the upper substrate and the silicon oxide of the posts. Although the bonding adhesive is present between the upper substrate and the posts, the thickness of the bonding adhesive is so small that the bonding adhesive negligibly influences the etching. Si is subjected to anisotropic selective etching in which the P-TEOS posts 14p may be used as an etching stopper. The P-TEOS posts 14p are then etched with an etching gas different from an etching gas used for etching Si. After that, the photoresist pattern PR is removed.

In the sample used in the experiment, the via holes 31 were formed so as to have a diameter of 20 µm. Si was etched by reactive ion etching (RIE) with a gas mixture of $SF_6$ and $C_4F_8$, at a gas pressure of 0.1 Torr, and at an electric power of 500 W. Si was etched at an etching rate of 20 µm/min. The selectivity ratio in the etching between Si and the P-TEOS film was 20:1 and the etching was stopped when the P-TEOS film was reached. The P-TEOS film was etched with a gas mixture of $CF_4$ and $O_2$. This etching was stopped when the rewiring layer 12 composed of copper was reached. This etching was conducted by overetching so that etching residue was not left. The undercut 32 under the bottom surface of the silicon substrate 20 had a small width of about 1 µm.

Thus, it has been demonstrated that considerable improvements have been made compared with the preliminary experiment in which the undercut having a width of about 5 µm was generated as a result of the etching of CYCLOTENE.

Figure 2G:
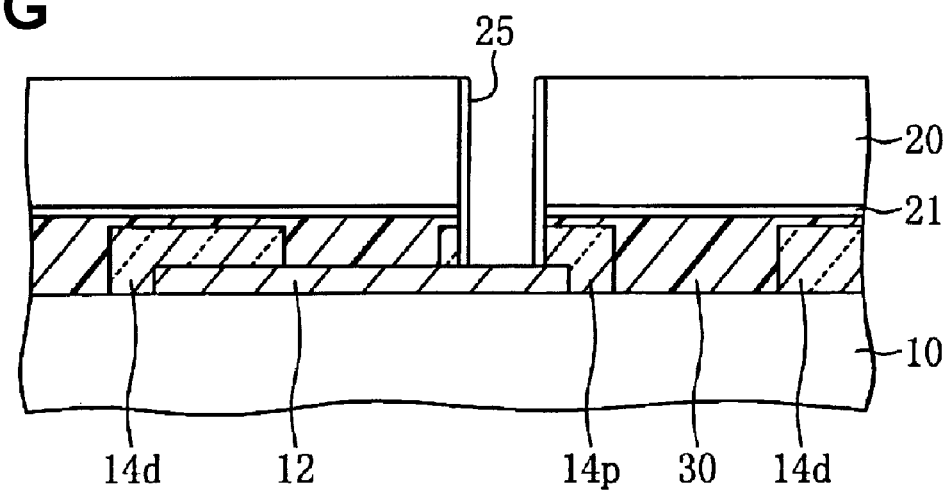

Referring to FIG. 2G, an insulation barrier film 25 composed of SiN is formed by plasma CVD. Specifically, after an insulation barrier film is formed, the insulation barrier film is subjected to an anisotropic etching such that flat portions of the insulation barrier film on the rewiring layer 12 composed of copper and on the top surface of the upper substrate 20 are removed.

In the sample used in the experiment, a silicon nitride film having a thickness of 200 nm was formed with silane and ammonia serving as source gases by PE-CVD at 300° C. As a result, a silicon nitride film having a sufficiently large thickness of about 120 nm was formed even in the bottom portions of the via holes. The silicon nitride film sufficiently covered even portions at the interface between the upper substrate 20 and the P-TEOS posts 14p and an area around the portions. The anisotropic etching was conducted by RIE with a gas mixture of $CF_4$ and $O_2$.

Figure 2H:
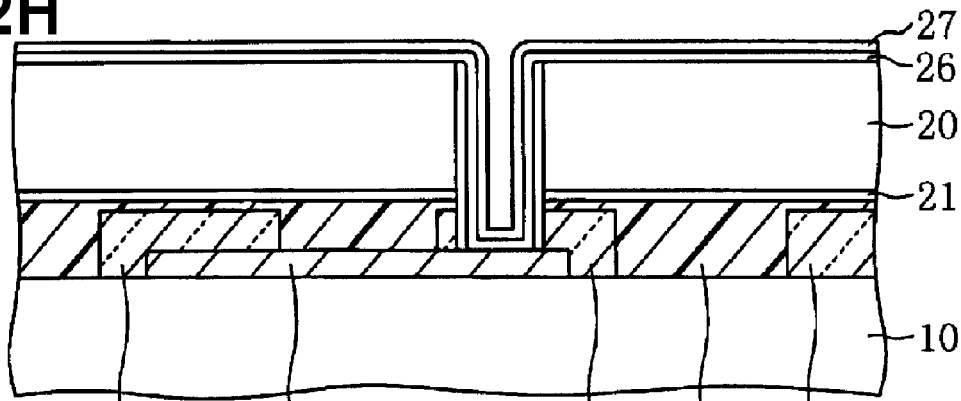

Referring to FIG. 2H, a barrier metal layer 26 composed of a Ti liner or the like and a Cu seed layer 27 are formed by physical vapor deposition (PVD) such as sputtering. In the sample used in the experiment, a Ti layer having a thickness of 100 nm and a Cu layer having a thickness of 250 nm were formed.

Figure 2I:
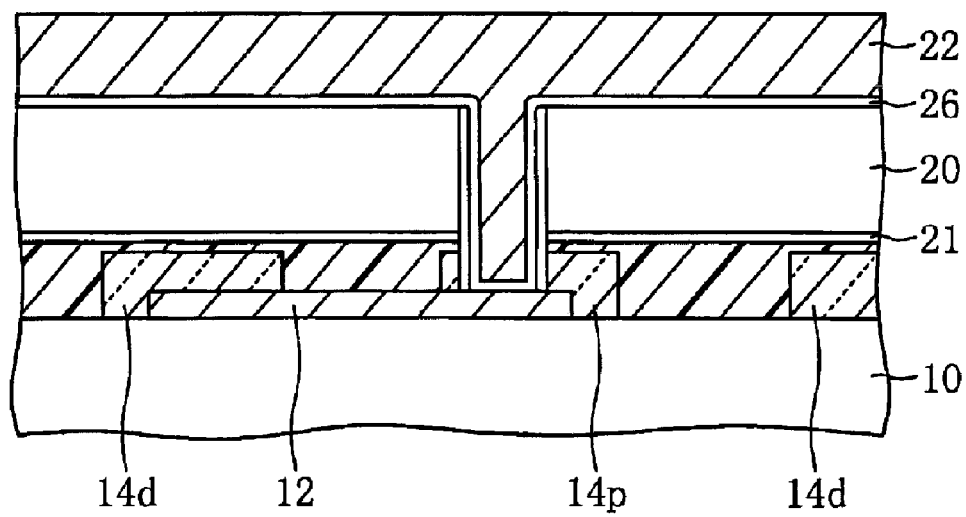

Referring to FIG. 2I, a Cu layer is formed on the Cu seed layer 27 by electrolytic plating to thereby fill the via holes with Cu. In FIG. 2I, the Cu seed layer and the plated Cu layer are collectively illustrated as a copper layer 22. The copper layer 22 is also grown on the top surface of the upper substrate 20. In the sample used in the experiment, a good plated layer was grown and no voids were generated.

Figure 2J:
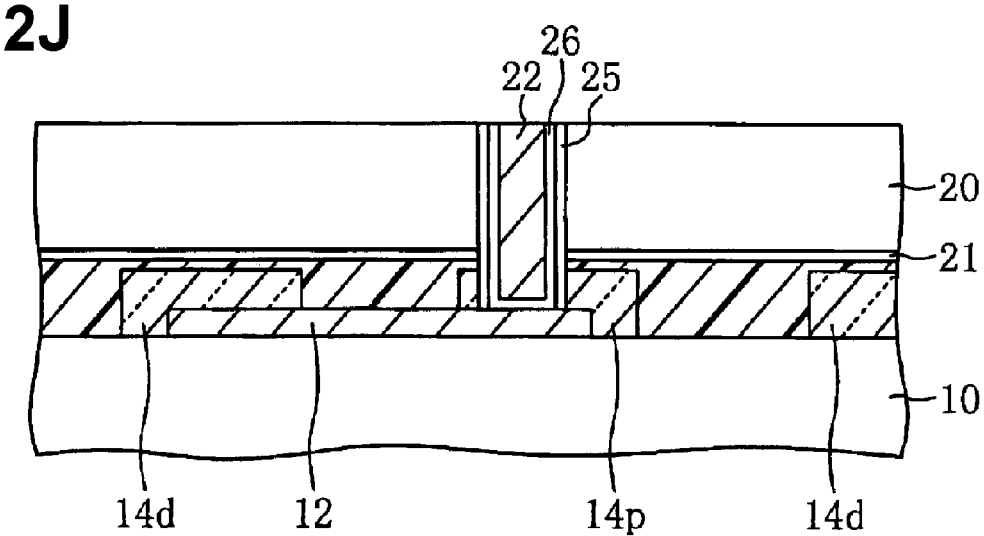

Referring to FIG. 2J, the unnecessary metal layer on the top surface of the upper substrate 20 is removed by chemical-mechanical polishing (CMP) or the like. As a result, substrate-through-via electrical conductors that are embedded in the upper substrate 20 and extend through the upper substrate 20 are obtained. If necessary, a rewiring layer may be formed as illustrated in FIG. 2A. A semiconductor substrate may be further laminated.

In the above-described embodiment, the posts were formed with the P-TEOS film. The posts have the function of allowing etching of an organic bonding resin to be replaced with etching of an inorganic material. As a result, via holes may be formed by etching so as to have good profiles. The material used for forming such posts is not restricted to P-TEOS and silicon oxide.

Silicon nitride may be used instead of silicon oxide. For example, a silicon nitride film may be formed with silane and ammonia serving as source gases by PE-CVD. A silicon nitride film is subjected to dry etching with, for example, a gas mixture of $CF_4$ and $O_2$. In the sample used in the experiment, a silicon nitride film had good embedding characteristics in the plating process and no voids were generated in the vias.

Alternatively, the posts may also be formed with silicon oxynitride SiON. An insulation inorganic material used for forming posts may have any composition as long as the material is a Si—O—C—N-based insulation material. A material for forming substrate-through-via electrical conductors is not restricted to Cu.

In a second embodiment, the substrate-through-via electrical conductors are formed of W. A W film may be formed by CVD. For example, a W film may be formed by CVD in which tungstenhexacarbonyl $W(CO)_6$ is used as a source gas and $H_2$ is used as a carrier gas. If necessary, a barrier metal layer composed of TiN or the like is used. In a sample used in an experiment, tungstenhexacarbonyl was used as a source gas and a W film was formed at 250° C. As a result, good via plugs having fewer seams were formed. The formation of a W film by CVD may also be conducted with another gas such as $WF_6$.

In a third embodiment, the substrate-through-via electrical conductors are formed of polysilicon. For example, a polysilicon film may be formed by PE-CVD in which silane is used as a source gas. In a sample used in an experiment, substrate-through-via electrical conductors were formed by PE-CVD with silane serving as a source gas, at 400° C., and at 100 Pa. The via holes were sufficiently filled and no defects such as voids were observed.

Cases where substrate-through-via electrical conductors are formed of Cu, W, or Si have been discussed. Cu has a thermal expansion coefficient of 16 ppm/° C., W has one of 4.3 ppm/° C., and Si has one of 2.3 ppm/° C. When a material used for forming posts has a thermal expansion coefficient close to such a value, the resultant residual stress probably falls within an allowable range. Specifically, a material used for forming posts desirably has a thermal expansion coefficient in the range of 2 to 18 ppm/° C.

Alternatively, posts may be formed of a material other than insulation materials. Posts may be formed of Si. For example, posts may be formed of a polycrystalline silicon film. In this case, etching for the formation of via holes may be conducted only by etching Si. Alternatively, bumps composed of Cu, Au, or the like may also be used as posts. When such bumps are formed so as to have a height equal to a distance between substrates and the bonding resin layer around substrate-through-via electrical conductors is formed so as to have a thickness of substantially zero, via holes may be formed by etching without generating an undercut.

Although the present invention has been described so far with reference to embodiments, the present invention is not restricted to these embodiments. It is evident to those skilled in the art that various modifications, replacements, improvements, combinations, or the like may be made.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor substrate including a first integrated circuit, a wiring layer is formed on a part of the first semiconductor substrate;
   a second semiconductor substrate mounted over the first semiconductor substrate, the second semiconductor substrate including a second integrated circuit;
   a post made of an inorganic substance and formed on a part of the wiring layer and a part of the first semiconductor substrate;
   an adhesive layer made of an organic substance arranged between the first and the second semiconductor substrates, the adhesive layer covers the post;
   a via made of an electrical conductor that penetrates through the second semiconductor substrate, the adhesive layer and the post, and reaches the wiring layer; and
   wherein the inorganic substance is silicon oxide or silicon nitride.

2. The semiconductor device according to claim 1, wherein the adhesive layer is arranged between the post and the second semiconductor substrate.

3. The semiconductor device according to claim 1, wherein a thermal expansion coefficient of the inorganic substance is in a range of between 2 ppm/° C. and 18 ppm/° C.

4. The semiconductor device according to claim 1, wherein the electrical conductor is cupper, tungsten or silicon.

* * * * *